United States Patent
Iba et al.

(10) Patent No.: US 6,313,535 B1
(45) Date of Patent: Nov. 6, 2001

(54) WIRING LAYER OF A SEMICONDUCTOR INTEGRATED CIRCUIT

(75) Inventors: Junichiro Iba, Mohigan Lake, NY (US); Masaki Narita; Tomio Katata, both of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/268,678

(22) Filed: Mar. 16, 1999

(30) Foreign Application Priority Data

Mar. 18, 1998 (JP) .................................................. 10-068309

(51) Int. Cl.[7] .................................................. H01L 23/48
(52) U.S. Cl. .......................... 257/751; 257/761; 257/763; 257/767
(58) Field of Search .................................... 257/761, 767, 257/751, 753, 763

(56) References Cited

U.S. PATENT DOCUMENTS

| | | | |
|---|---|---|---|
| 4,158,613 | * | 6/1979 | Sogo ........................................ 204/15 |
| 4,786,962 | * | 11/1988 | Koch ...................................... 257/761 |
| 5,306,952 | * | 4/1994 | Matsuura et al. ..................... 257/765 |
| 5,518,805 | * | 5/1996 | Ho et al. ............................... 428/213 |
| 5,635,763 | * | 6/1997 | Inoue et al. ........................... 257/763 |
| 5,818,110 | * | 10/1998 | Cronin ................................... 257/775 |

OTHER PUBLICATIONS

L. Forester et al.: "Development of a Global Planarization Process without CMP"; Procedings of the 11th Int VLSI Multilever Interconnection Conference; Jun. 1994, pp. 172–178.

T. Imai et al.; "2.0 $\mu$m pitch 6–level metallization process for high performance application integrated circuits"; Proc. of 13th Int. VLSI Multilevel Interconnection Conference; Jun. 1996, pp. 17–22.

* cited by examiner

Primary Examiner—T. N. Quach
(74) Attorney, Agent, or Firm—Banner & Witcoff, Ltd.

(57) ABSTRACT

A wiring layer of a semiconductor integrated circuit comprises a first conductive film made of a material containing Al. A material, which reacts with Al at a rate lower than that at which Ti reacts with Al, is provided on the first conductive film. A first barrier metal film is formed, and an interlayer insulating film is formed thereon. An opening is formed in the interlayer insulating film so as to expose the first barrier metal film. The opening is buried to form a second conductive film electrically connected to the first conductive film.

6 Claims, 9 Drawing Sheets

WIRING LAYER OF A SEMICONDUCTOR INTEGRATED CIRCUIT

BACKGROUND OF THE INVENTION

The present invention relates to a semiconductor device of a multilayered wiring structure, and more particularly to a semiconductor device in which a lower wiring layer is made of a material containing Al and upper and lower wiring layers are connected via a barrier metal film interposed therebetween.

In general, barrier metal films are formed above and below a wiring layer in a semiconductor device in order to protect the wiring layer and improve reliability. This matter is described in, for example, "Proceedings of 11th International VLSI Multilevel Interconnection Conference (1994)", pages 172 to 178.

A method for manufacturing a conventional semiconductor device having barrier metal films will be described with reference to FIGS. 23 and 24.

First, as shown in FIG. 23, an insulating film 101 is formed on a part or the main surface of an active area having source/drain regions and a gate on a silicon substrate. A Ti film 102, a TiN film 103, an AlCu film 104, a Ti film 105 and a TiN film 106 are formed in this order on the silicon substrate.

The AlCu film 104 constitutes a first wiring layer. The Ti film 102 and the TiN film 103 formed under the AlCu film 104 and the Ti film 105 and the TiN film 106 formed above it are used as barrier metal films of the wiring layer including the AlCu film 104.

The barrier metal films have a multilevel structure constituted by two layers, each including Ti and TiN films. The TiN film 106 of the upper barrier metal film is also used as anti-reflection layer for lithography. The Ti film 105 is also used to prevent the surface of the AlCu film 104 from being nitrided when the TiN film 106 is deposited.

Then, as shown in FIG. 24, an $SiO_2$ film 107 serving as an interlayer insulating film is deposited on the main surface of the substrate. Thereafter, a resist pattern (not shown) is formed on the substrate by means of the lithography. Using the resist pattern as a mask, the $SiO_2$ film is selectively etched by the RIE method. Subsequently, the resist pattern is removed, thereby forming a via 108.

Thereafter, a Ti film 110, a TiN film 111, and an AlCu film 109 to be a wiring material, are deposited on the main surface and then patterned. As a result, a second wiring layer 109, electrically connected to the AlCu film 104, is formed.

In the conventional method described above, after annealing at 450° for 60 minutes, a sheet resistance of a wiring layer including an AlCu film 104 was increased to about 0.45 ($\Omega/\square$). Thus, the conventional method has a problem that an increase in wiring resistance must be suppressed. Further, it is desirable that the overall lower wiring layer including the upper and lower barrier metal films be thin.

BRIEF SUMMARY OF THE INVENTION

The present invention has been made in consideration of the aforementioned drawbacks of the prior art. It is therefore an object of the present invention to provide a semiconductor device having a thin and low-resistance wiring layer, which can be used in a refine apparatus, and a method for manufacturing the same.

The object of the present invention is achieved by a semiconductor device comprising: a first conductive film made of a material, such as AlCu, containing Al; a first barrier metal film provided on the first conductive film, the first barrier metal film containing a material, such as W, which reacts with Al at a rate lower than that at which Ti reacts with Al; an interlayer insulating film, such as $SiO_2$, provided on the first barrier metal film; an opening provided in the interlayer insulating film so as to expose the first barrier metal film; and a second conductive film, such as AlCu, TiN or Ti, provided to bury the opening and electrically connected to the first conductive film.

With the above structure, when the first barrier metal film is made of W, it satisfactorily functions as an etching stopper, since the etching selectivity of W to $SiO_2$ is 40. The W film improves the electro-migration resistance of the AlCu film. Furthermore, the W film heat-reacts with Al as a Ti film does, which is conventionally used. However, since the degree of heat reaction of the W film with Al film is fully lower than that of the Ti film with Al film, the increase in sheet resistance of the AlCu film, caused by the heat reaction, is suppressed. Consequently, even if the lower wiring layer is thinner than that of the conventional device, the resistance of the lower wiring layer can be satisfactorily low.

The object of the present invention is also achieved by a method for manufacturing a semiconductor device comprising the steps of: forming a first conductive film made of a material, such as AlCu, containing Al; forming a first barrier metal film on the first conductive film, the first barrier metal film containing a material, such as W, which reacts with Al at a rate lower than that at which Ti reacts with Al; forming a first wiring layer by patterning a multilayered film including the first conductive film and the first barrier metal film to a desired shape; forming an interlayer insulating film on the first barrier metal film; forming an opening in the interlayer insulating film, such as $SiO_2$, by selective etching so as to expose the first barrier metal film; and forming a second wiring layer electrically connected to the first wiring layer by burying the opening.

According to the above method, there is provided a semiconductor device having a thin and low-resistance wiring layer, which can be used in a refine apparatus.

Further, the object is achieved by the method, wherein the aforementioned step of forming a second wiring layer includes the steps of: forming a buried layer in the opening by selective growth; forming a second conductive film on a main surface of the multilayered film; and patterning the second conductive film.

This method has the following advantage in addition to that obtained by the first-mentioned method. Since the buried contact is formed in the opening by selectively growing W, the opening of a high aspect ratio can be buried automatically. Therefore, the two wiring layers can be brought into contact with each other easily and satisfactorily.

The object of the present invention is also achieved by a method for manufacturing a semiconductor device comprising the steps of: forming a first conductive film made of a material containing Al; forming a first barrier metal film on the first conductive film, the first barrier metal film containing a material which reacts with Al at a rate lower than that at which Ti reacts with Al; forming an insulating film on the first barrier metal film; forming a first wiring layer by patterning a multilayered film including the first conductive film, the first barrier metal film and the insulating film to a desired shape; forming an interlayer insulating film on the multilayered film; forming an opening in the interlayer insulating film and the insulating film by selective etching so as to expose the first barrier metal film; and forming a second wiring layer electrically connected to the first wiring layer by burying the opening.

This method has the following advantage in addition to those obtained by the aforementioned methods. Since the insulating film is provided on the W film as the first barrier metal film, even if the resist film serving as a mask is not satisfactorily thick, the insulating film under the resist functions as a mask in the step of patterning the multilayered film. Therefore, the semiconductor device can be processed with high accuracy and the margin of process can be improved.

The object of the present invention is also achieved by a method for manufacturing a semiconductor device comprising the steps of: forming a first barrier metal film containing a material which reacts with Al at a rate lower than that at which Ti reacts with Al; forming a first conductive film made of a material containing Al; forming a second barrier metal film on the first conductive film, the second barrier metal film containing a material which reacts with Al at a rate lower than that at which Ti reacts with Al; forming an insulating film on the second barrier metal film; forming a first wiring layer by patterning a multilayered film including the first conductive film, the first and the second barrier metal film and the insulating film to a desired shape; forming an interlayer insulating film on the multilayered film; forming an opening in the interlayer insulating film and the insulating film by selective etching so as to expose the second barrier metal film; and forming a second wiring layer electrically connected to the first wiring layer by burying the opening.

This method has the following advantage in addition to those obtained by the aforementioned methods. Since the insulating film is provided on the W film, even if the resist film serving as a mask is not satisfactorily thick, the insulating film under the resist functions as a mask in the step of patterning the multilayered film. Therefore, the semiconductor device can be processed with high accuracy and the margin of process can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described with reference to the accompanying drawings. However, the present invention is not limited to these embodiments, but can be variously modified.

A semiconductor device and a method for manufacturing the same according to a first embodiment will now be described with reference to the cross-sectional views shown in FIGS. 1 to 7.

Figure 1:
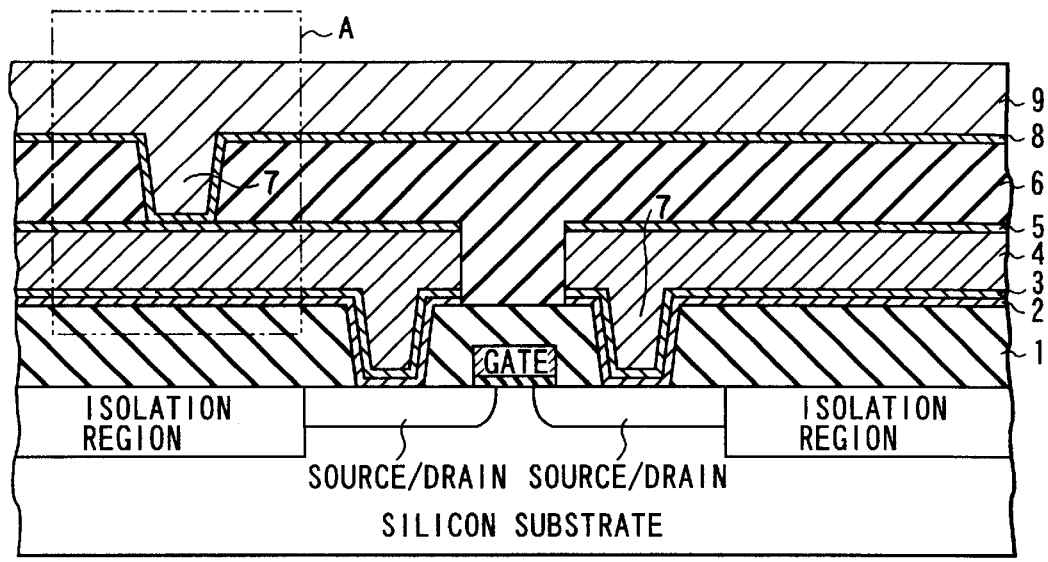
FIG. 1 is a cross-sectional view showing a semiconductor device according to a first embodiment of the present invention.

FIG. 1 is a cross-sectional view of a finished semiconductor device according to the first embodiment.

The present invention is characterized by the portion A enclosed by the broken line in FIG. 1. Therefore, the embodiments of the present invention will be described below with reference to the drawings which show the portion A.

Figure 2:
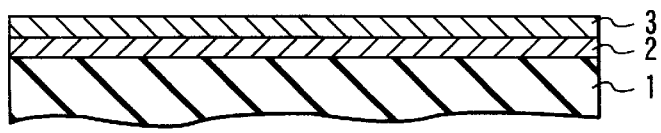
FIG. 2 is a cross-sectional view showing a step of manufacturing a semiconductor device according to the first embodiment of the present invention.

As shown in FIG. 2, the first Ti film 2, having a thickness of, for example, 10 nm, is deposited on the insulating film 1 by the sputtering method or the like.

Then, the TiN film 3, having a thickness of, for example, 10 nm, is deposited on the first Ti film 2 by the sputtering method or the like.

Figure 3:
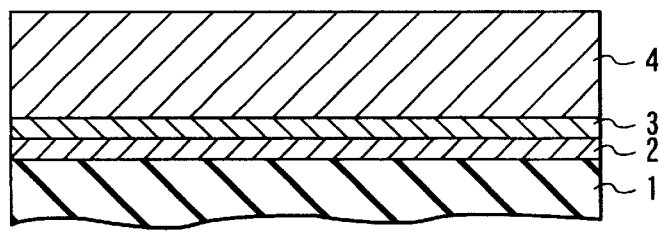
FIG. 3 is a cross-sectional view showing a manufacturing step subsequent to the step shown in FIG. 2.

Subsequently, as shown in FIG. 3, the AlCu film 4, having a thickness of, for example, 200 nm, is deposited on the TiN film 3 by the sputtering method or the like.

Figure 4:
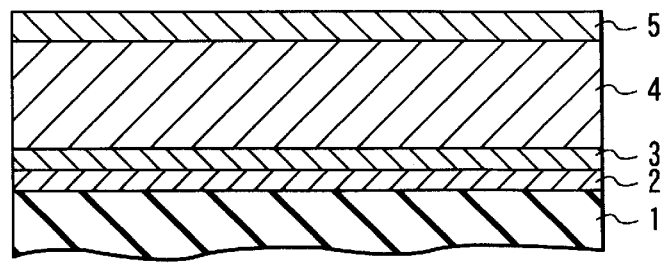
FIG. 4 is a cross-sectional view showing a manufacturing step subsequent to the step shown in FIG. 3.

Then, as shown in FIG. 4, the W film 5, having a thickness of, for example, 20 nm, is deposited on the AlCu film 4 by the sputtering method or the like.

Figure 5:
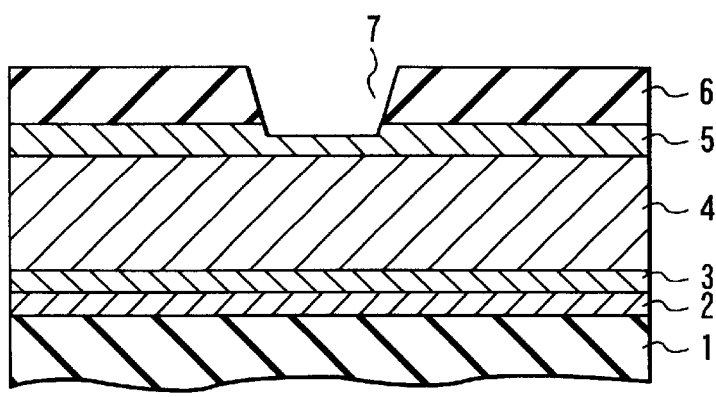
FIG. 5 is a cross-sectional view showing a manufacturing step subsequent to the step shown in FIG. 4.

Thereafter, as shown in FIG. 5, a multilayered film including the first Ti film 2, the TiN film 3, the AlCu film 4 and the W film 5 is patterned to a desired wiring pattern by a photolithography process and an etching process, such as the RIE, thereby forming a wiring layer (lower wiring layer). In the RIE in the patterning process, a mixture gas containing, for example, $Cl_2$, $BCl_2$ and $N_2$, is used as etching gas.

Subsequently, the $SiO_2$ film 6, serving as an interlayer insulating film, is deposited on the main surface by the CVD. Then, the via 7 is formed in the $SiO_2$ film 6 by photolithography and etching processes so as to expose the W film 5.

Figure 6:
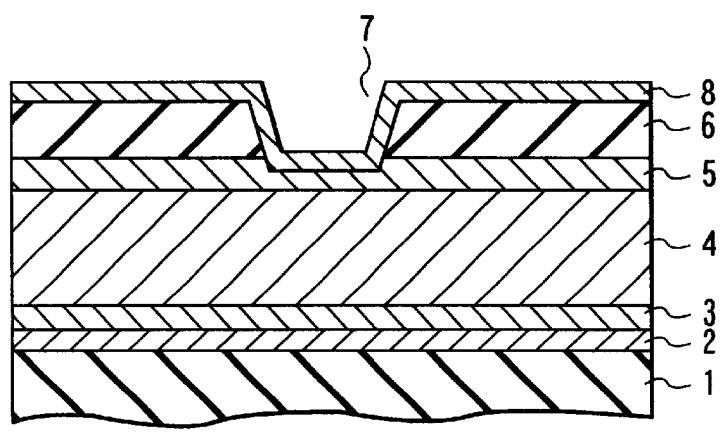
FIG. 6 is a cross-sectional view showing a manufacturing step subsequent to the step shown in FIG. 5.

Thereafter, the resist pattern, used when the via 7 is formed, is removed. Then, as shown in FIG. 6, the second Ti film 8, having a thickness of, for example, 20 nm, is deposited on the main surface by the sputtering method or the like.

Figure 7:
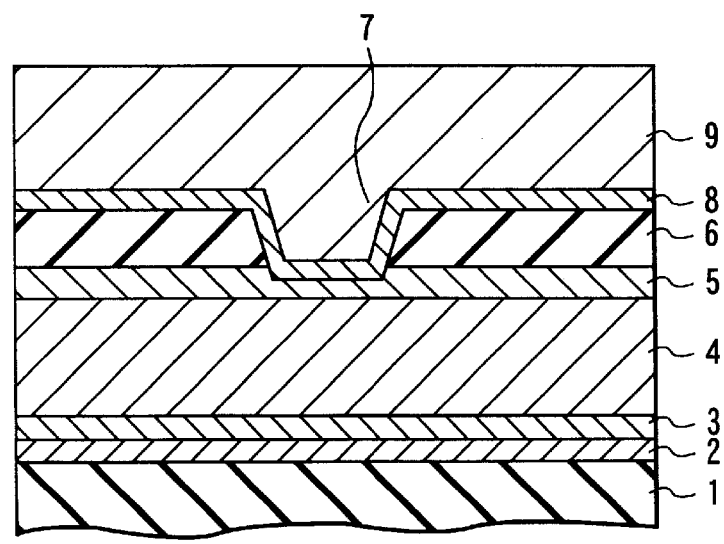
FIG. 7 is a cross-sectional view showing a manufacturing step subsequent to the step shown in FIG. 6.

Then, as shown in FIG. 7, the Al film 9, having a thickness of, for example, 230 nm, is deposited on the main surface by the sputtering method or the like. Thereafter, a multilayered film including the second Ti film 6 and the Al film 9 is patterned to form an upper wiring layer. As a result, a semiconductor device is obtained, which has upper and lower wiring layers electrically connected to each other through the via 7.

In the semiconductor device obtained by the method described above according to the first embodiment, the W film 5, serving as a barrier film, is formed between the AlCu film 4 constituting the lower wiring layer and the Al film 9 constituting the upper wiring layer.

The W film 5 of 20 nm is comparatively thin. However, when the via 7 is formed in the $SiO_2$ film 6, the W film 5 satisfactorily functions as an etching stopper due to etching conditions, since the etching selectivity of W to $SiO_2$ is 40, while in the conventional apparatus, the etching selectivity of TiN to $SiO_2$ is 20.

Figure 22:
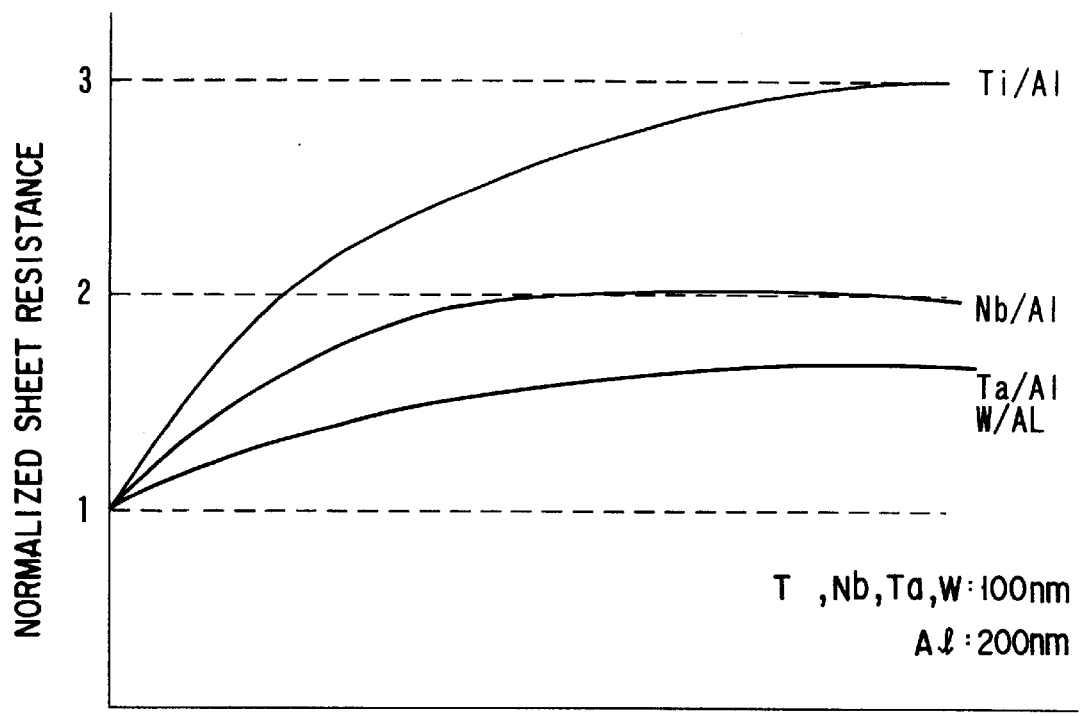
FIG. 22 is a diagram showing a change in reaction with the lapse of time, in which the sheet resistance before annealing is represented as 1.
Figure 23:
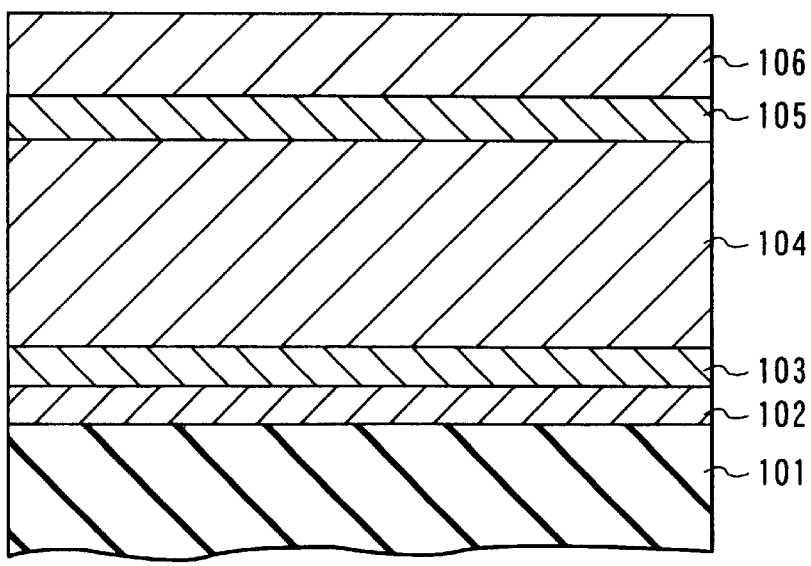
FIG. 23 is a cross-sectional view showing a conventional semiconductor device.
Figure 24:
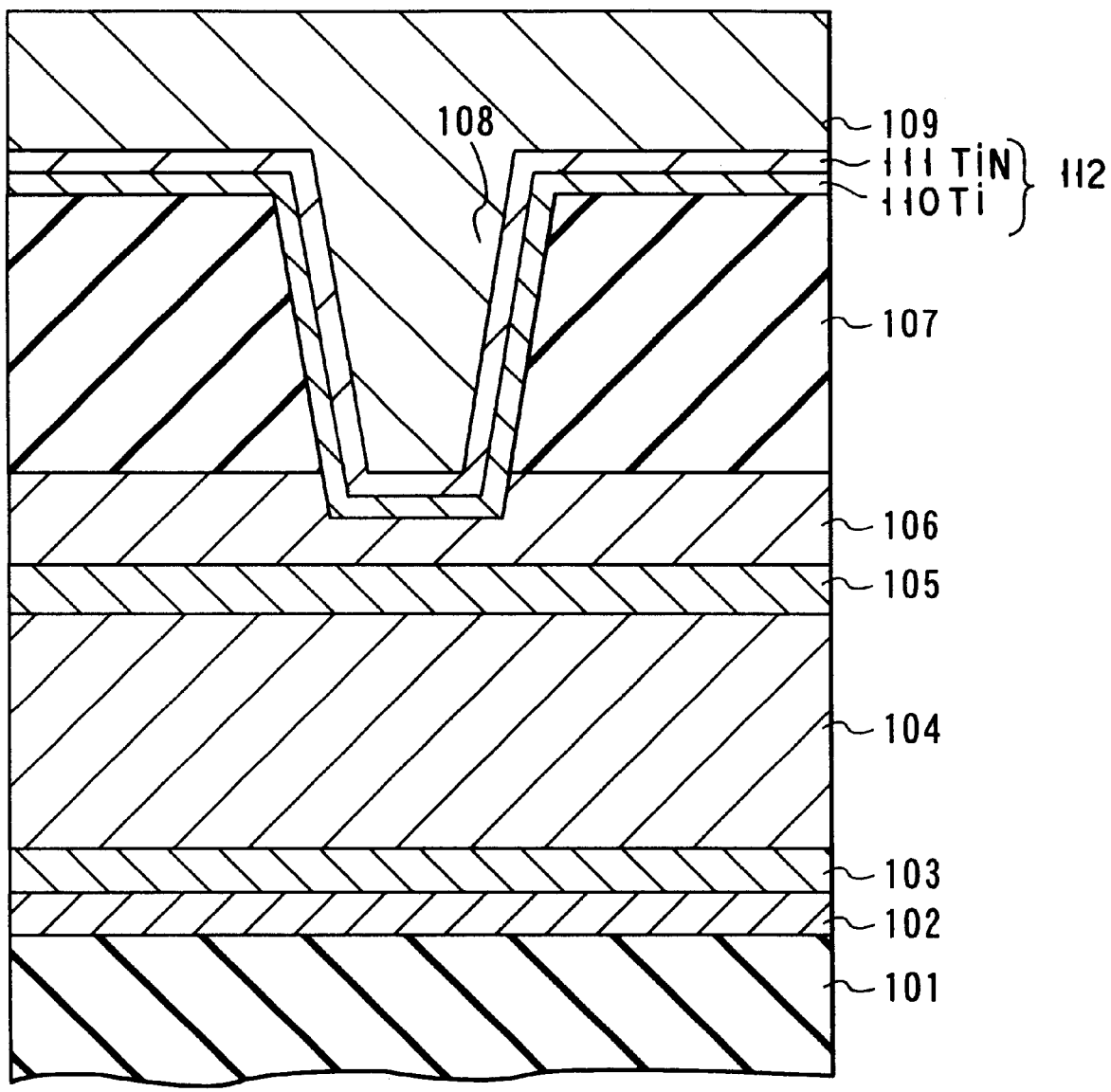
FIG. 24 is a cross-sectional view showing a manufacturing step subsequent to the step shown in FIG. 23.

Further, the W film 5 improves the electro-migration resistance of the AlCu film 4. Furthermore, the W film 5 heat-reacts on Al as a Ti film does, that is conventionally used. Since, as shown in FIG. 22, the degree of heat reaction of a W film is fully lower than that of a Ti film, the increase in sheet resistance of the AlCu film 4, caused by the heat reaction, is suppressed. FIG. 22 is a diagram showing a change in reaction with the lapse of time, in which the sheet resistance before annealing is represented as 1.

Consequently, even if the lower wiring layer is thinner than that of the conventional device, the resistance of the lower wiring layer can be satisfactorily low. In the above embodiment, the W film 5 is used as a barrier metal film. However, any material can be used in place of W, so long as it reacts with Al at a rate lower than that at which Ti reacts with Al.

Figure 8:
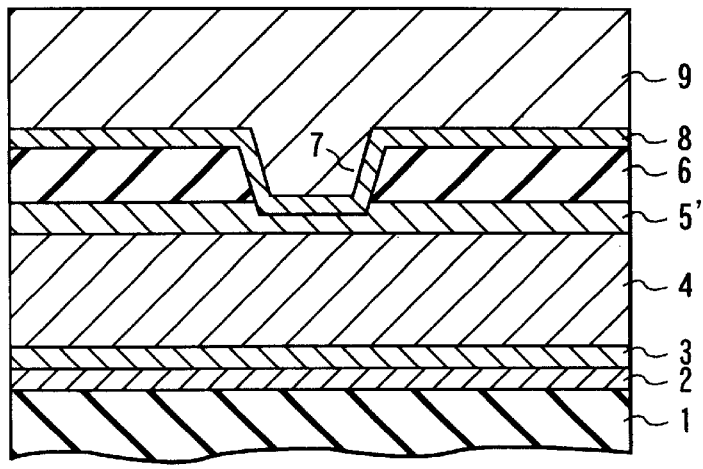
FIG. 8 is a cross-sectional view showing a semiconductor device according to a modification of the first embodiment of the present invention.
Figure 9:
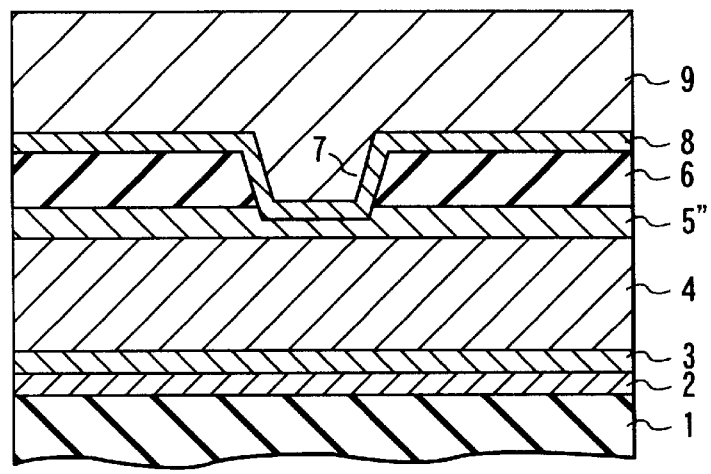
FIG. 9 is a cross-sectional view showing a semiconductor device according to another modification of the first embodiment of the present invention.

For example, the W film 5 can be replaced by an Nb film 5' as shown in FIG. 8, or a Ta film 5" as shown in FIG. 9.

A semiconductor device and a method for manufacturing the same according to a second embodiment will now be described with reference to the cross-sectional views shown in FIGS. 10 to 12.

In this embodiment, the first step to the step of forming a W film 5 shown in FIG. 4 are the same as those of the first embodiment.

In the second embodiment, after the W film 5 is formed, an insulating film 10, having a thickness of, for example, 30 nm, is deposited by the CVD or the like. An SiN film or an $SiO_2$ film is used as the insulating film 10.

After the insulating film 10 is deposited, a multilayered film including a first Ti film 2, a TiN film 3, a AlCu film 4 and the W film 5 is patterned to a desired wiring pattern by the photolithography process and the etching process, such as the RIE, thereby forming a lower wiring layer.

In the RIE in the patterning process, a mixture gas containing, for example, $CHF_3$, $CF_4$ and $O_2$, is used as an etching gas to etch the W film 5 and the insulating film 10. To etch the remaining films, i.e., the first Ti film 2, the TiN film 3 and the AlCu film 4, a mixture gas containing, for example, $Cl_2$, $BCl_2$ and $N_2$, is used as etching gas.

Subsequently, in the same manner as in the step shown in FIG. 5, an $SiO_2$ film 6, serving as an interlayer insulating film, is deposited on the main surface by the CVD. Then, a via hole 7 is formed in the $SiO_2$ film 6 by photolithography and etching processes so as to expose the W film 5.

Thereafter, the resist pattern, used when the via hole 7 is formed, is removed. Then, in the same manner as in the step shown in FIG. 6, a second Ti film 8, having a thickness of, for example, 20 nm, is deposited on the main surface by the sputtering method or the like.

Then, in the same manner as in the step shown in FIG. 7, an Al film 9, having a thickness of, for example, 300 nm, is deposited on the main surface by the sputtering method or the like. Thereafter, a multilayered film including the second Ti film 8 and the Al film 9 is patterned to form an upper wiring layer. As a result, a semiconductor device is obtained, which has upper and lower wiring layers electrically connected to each other through the via 7.

According to the second embodiment, the following advantage can be obtained in addition to that of the first embodiment. When the multilayered film is patterned, the insulating film 10 formed on the W film 5 can function as a mask, even if the resist film serving as a mask has an insufficient thickness. Therefore, the semiconductor device can be processed with higher accuracy and the margin of process can be improved as compared to the first embodiment.

Figure 11:
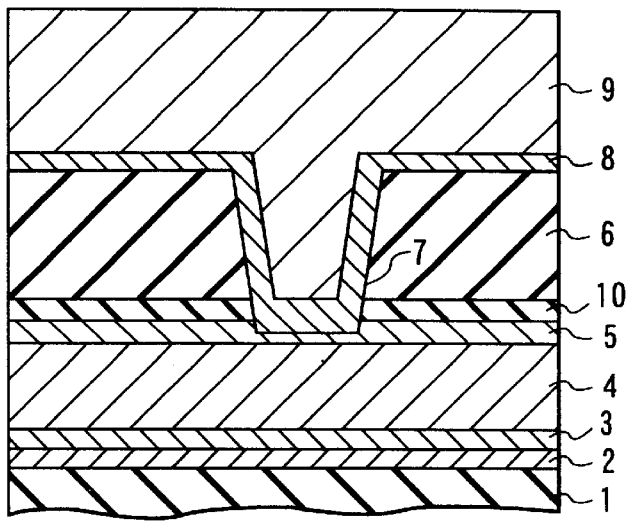
FIG. 11 is a cross-sectional view showing a semiconductor device according to a modification of the second embodiment of the present invention.
Figure 12:
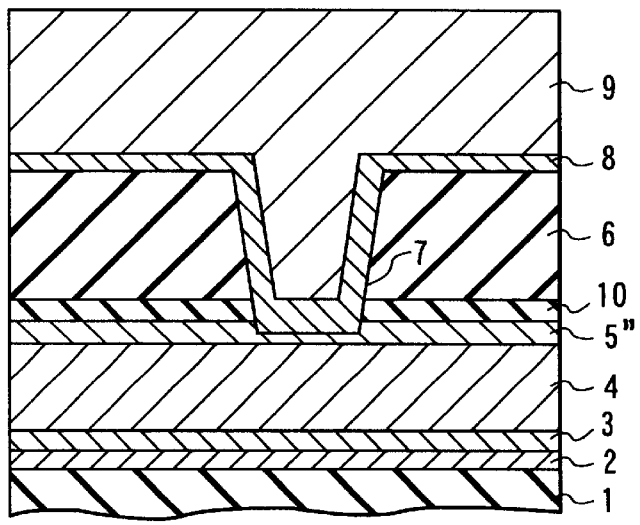
FIG. 12 is a cross-sectional view showing a semiconductor device according to another modification of the second embodiment of the present invention.

In the second embodiment, the W film 5 can be replaced by an Nb film 5' as shown in FIG. 11, or a Ta film 5" as shown in FIG. 12.

Figure 13:
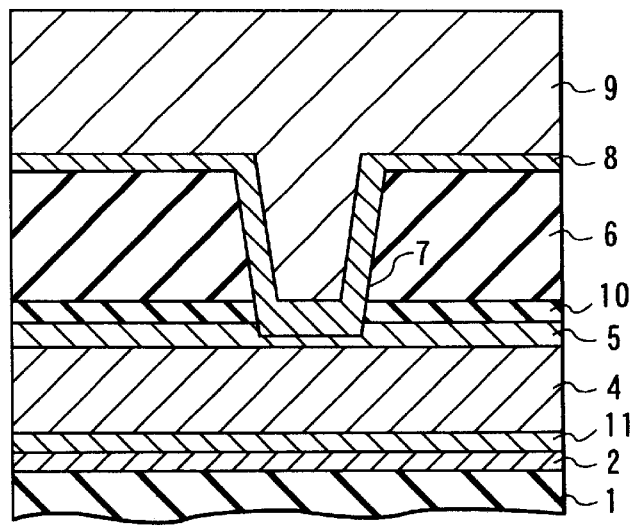
FIG. 13 is a cross-sectional view showing a semiconductor device according to a third embodiment of the present invention.

A semiconductor device and a method for manufacturing the same according to a third embodiment will now be described with reference to the cross-sectional views shown in FIGS. 13 to 15.

Figure 10:
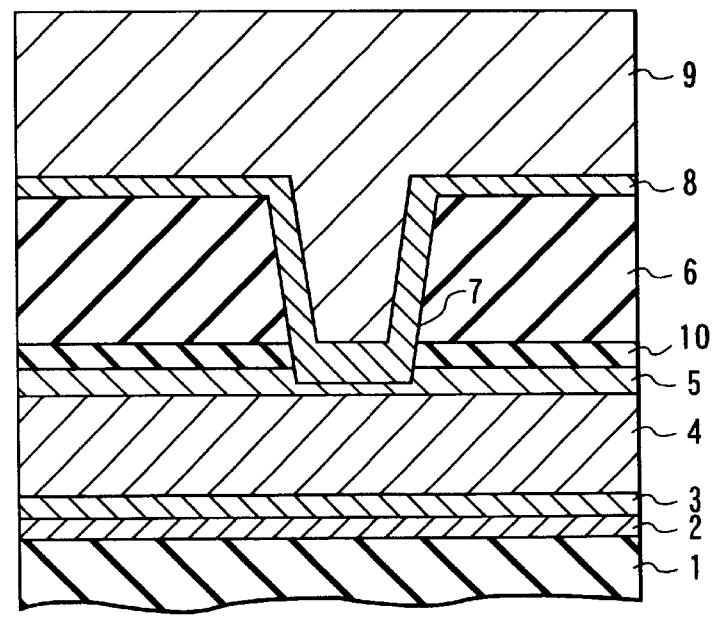
FIG. 10 is a cross-sectional view showing a semiconductor device according to a second embodiment of the present invention.

The third embodiment is the same as the second embodiment shown in FIG. 10 except that a W film 11 is deposited in place of the TiN film 3.

According to the third embodiment, the following advantage can be obtained in addition to those of the second embodiment. Since the W film 11 is deposited in place of the TiN film 3, the same chamber can be used to form both the W film 11 and the W film 5. Therefore, the structure of the apparatus for manufacturing the device is simplified.

Figure 14:
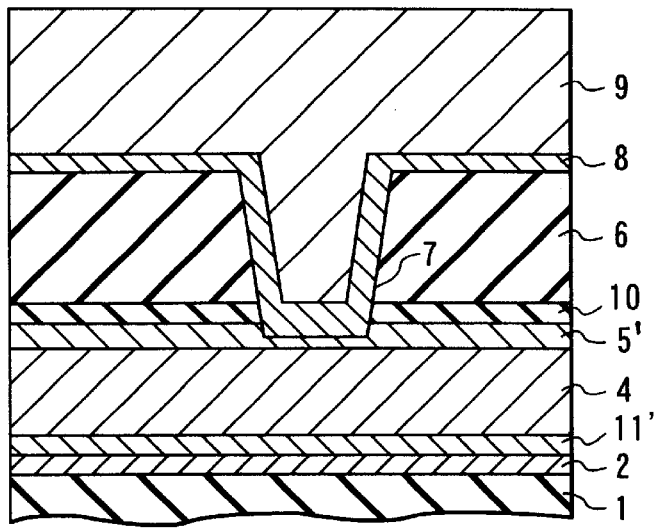
FIG. 14 is a cross-sectional view showing a semiconductor device according to a modification of the third embodiment of the present invention.
Figure 15:
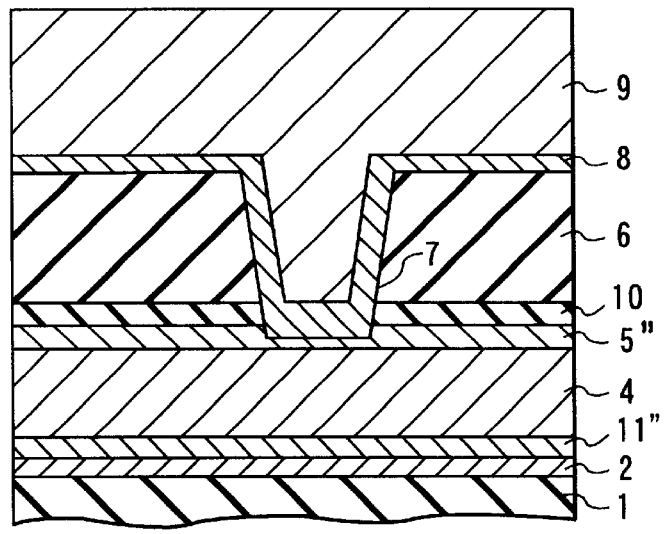
FIG. 15 is a cross-sectional view showing a semiconductor device according to another modification of the third embodiment of the present invention.

In the third embodiment, the W film 5 and the W film 11 can be replaced by an Nb film 5' and an Nb film 11' as shown in FIG. 14, or a Ta film 5" and a Ta film 11" as shown in FIG. 15.

A semiconductor device and a method for manufacturing the same according to a fourth embodiment will now be described with reference to the cross-sectional views shown in FIGS. 16 to 18.

The fourth embodiment is the same as the third embodiment in the following steps: forming a W film 5, forming an insulating film 10 thereon, patterning these films to form the lower wiring layer, depositing an $SiO_2$ film 6 as an interlayer insulating film on the main surface, and then forming the via 7 in the $SiO_2$ film 6 to expose the W film 5.

Thereafter, according to the fourth embodiment, W is grown by the selective growth method in the via 7, thereby forming a buried contact 12. Then, in the same manner as in the first to third embodiments, the second Ti film 8 and the Al film 9 are deposited, and subsequently the multilayered film including the second Ti film 8 and the Al film 9 is patterned, so that the upper wiring layer is formed. As a result, a semiconductor device is obtained, which has upper and lower wiring layers electrically connected to each other through the via 7.

According to the fourth embodiment, the following advantage can be obtained in addition to those of the third embodiment. Since the buried contact 12 is formed in the via 7 by selectively growing W, the via of a high aspect ratio can be buried automatically, so that the two wiring layers can be brought into contact with each other easily and satisfactorily.

Figure 17:
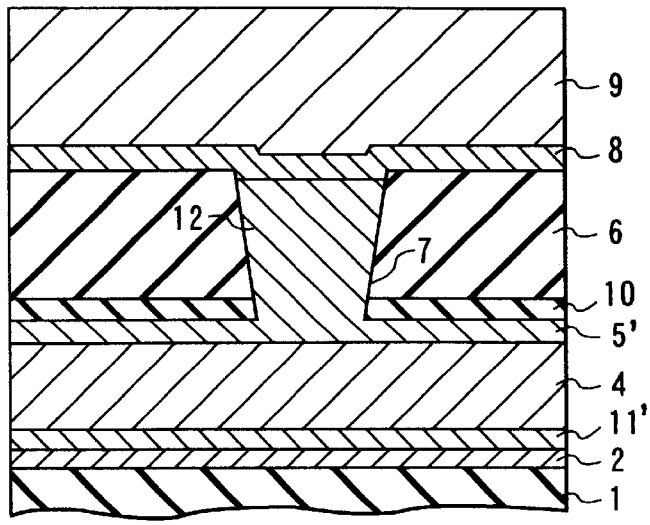
FIG. 17 is a cross-sectional view showing a semiconductor device according to a modification of the fourth embodiment of the present invention.
Figure 18:
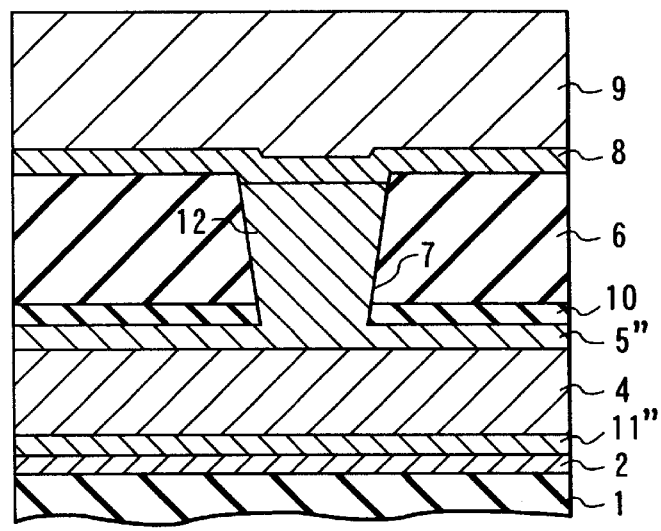
FIG. 18 is a cross-sectional view showing a semiconductor device according to another modification of the fourth embodiment of the present invention.

In the fourth embodiment, the W film 5 and the W film 11 can be replaced by an Nb film 5' and an Nb film 11' as shown in FIG. 17, or a Ta film 5" and a Ta film 11" as shown in FIG. 18, and the via 7 can be filled with the same metal as the material of the replaced film (Nb or Ta film) by means of the selective growth, so that the buried contact 12 can be formed.

In the case where the Nb or Ta film described above is used, it also serves satisfactorily as an etching stopper in the step of forming the via 7 in the $SiO_2$ film 6. Moreover, although the Nb or Ta film heat-reacts on Al, the degree of heat reaction of the film is substantially the same as that of the W film 5, i.e., fully lower than that of a Ti film conventionally used. Therefore, the increase in sheet resistance of the AlCu film 4, caused by the heat reaction, is suppressed. Consequently, even if the lower wiring layer is thinner than that of the conventional device, the resistance of the lower wiring layer can be satisfactorily low.

Figure 19:
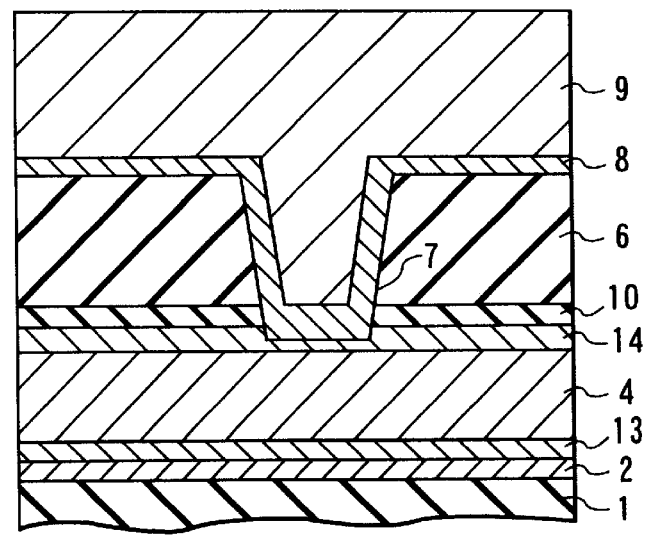
FIG. 19 is a cross-sectional view showing a semiconductor device according to a fifth embodiment of the present invention.

A semiconductor device and a method for manufacturing the same according to a fifth embodiment will now be described with reference to the cross-sectional view shown in FIG. 19.

In this embodiment, a metal film 13 containing either Nb or Ta is formed in place of the W film 11 in the third embodiment, and a metal film 14 containing either Nb or Ta is formed in place of the W film 5.

According to the fifth embodiment, the following advantage can be obtained in addition to those of the fourth embodiment. Since the metal films 13 and 14 are made of one of W, Nb and Ta, a metal material which is suitable for the manufacturing line of the user and applies the minimum load thereto can be selected from W, Nb and Ta. Consequently, the lifetime of the manufacturing apparatus can be prolonged.

Figure 16:
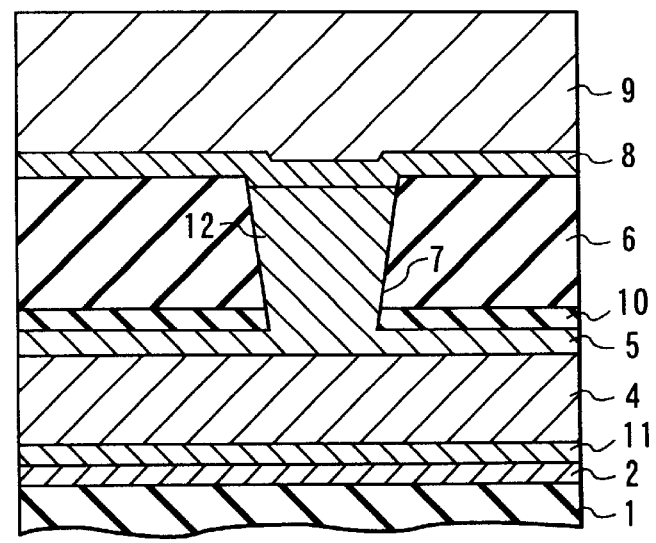
FIG. 16 is a cross-sectional view showing a semiconductor device according to a fourth embodiment of the present invention.

In this embodiment also, the same metal as the material of the metal film 14 used in place of the W film 5 may be selectively grown, so that the buried contact 12 as shown in FIG. 16 can be formed.

Figure 20:
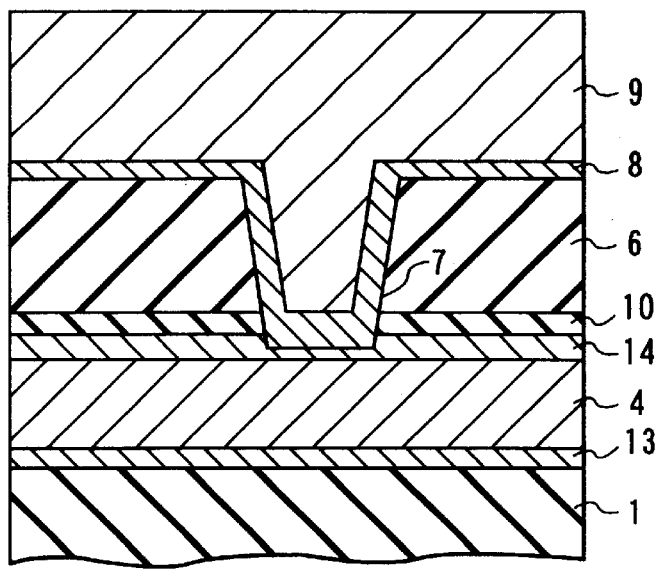
FIG. 20 is a cross-sectional view showing a semiconductor device according to a sixth embodiment of the present invention.

A semiconductor device and a method for manufacturing the same according to a sixth embodiment will now be described with reference to the cross-sectional view shown in FIG. 20.

In this embodiment, formation of the first Ti film 2 in the fifth embodiment is omitted.

Even if the first Ti film 2 is not formed, the same advantages as those of the fifth embodiment can be obtained.

Figure 21:
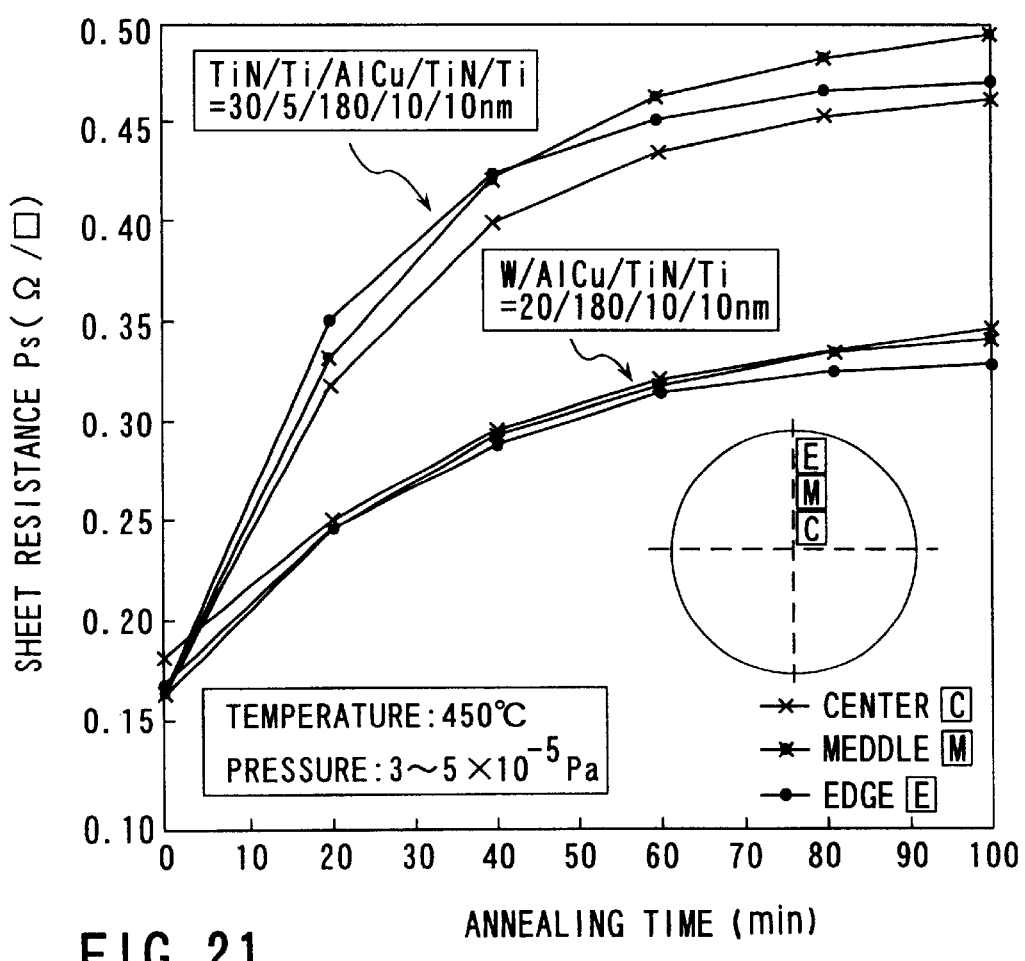
FIG. 21 is a characteristic diagram showing the relationship between an annealing time and a sheet resistance ρs (Ω/□) of the lower wiring layer, both in the conventional semiconductor device which has a multilayered film including a Ti film and a TiN film as an upper barrier metal film and the semiconductor device of the present invention which has a W film as an upper barrier metal film.

FIG. 21 is a characteristic diagram showing the relationship between an annealing time and a sheet resistance ρs ($\Omega/\square$) of the lower wiring layer, both in the conventional semiconductor device which has a multilayered film including a Ti film and a TiN film as an upper barrier metal film and the semiconductor device of the present invention which has a W film as an upper barrier metal film.

In the conventional semiconductor device, the thickness of the TiN film, the Ti film, the AlCu film, the TiN film and the Ti film is, 30 nm, 5 nm, 180 nm, 10 nm and 10 nm, respectively. In the apparatus of the present invention, the thickness of the W film, the AlCu film, the TiN film and Ti film is 20 nm, 180 nm, 10 nm and 10 nm. In both cases, the annealing temperature is 450° C.

As shown in the diagram, after annealing at 450° C. for 60 minutes, the sheet resistance of the wiring layer including the AlCu film of the conventional device is increased to about 0.45 ($\Omega/\square$). On the other hand, according to the present invention, the sheet resistance is as low as about 0.30 ($\Omega/\square$). Thus, the increase in the wiring resistance is suppressed by the present invention. Moreover, the thickness of the lower wiring layer as a whole, including the upper and lower barrier metal films, can be thinner than that of the conventional device.

As has been described above, the present invention can provide a semiconductor device having a thin and low-resistance wiring layer, which can be used in a refine apparatus, and a method for manufacturing the same.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a first conductive film made of a material containing Al;

a first barrier metal film provided on the first conductive film, wherein the first barrier metal film comprises one of W, Nb, and Ta, and wherein the first barrier metal film reacts with Al at a rate slower than the rate at which Ti reacts with Al;

an interlayer insulating film provided on the first barrier metal film;

an opening provided in the interlayer insulating film so as to expose the first barrier metal film; and a second conductive film provided to bury the opening, wherein the second conductive film is electrically connected to the first conductive film, and wherein the second conductive film comprises (i) a buried layer which is in direct contact with the first barrier metal film, fills the opening, and is made of substantially the same material as the first barrier metal film, and (ii) a wiring layer provided on the buried layer.

2. The semiconductor device according to claim 1, further comprising a second barrier metal film formed under the first conductive film.

3. The semiconductor device according to claim 2, wherein the second barrier metal film comprises a multilayered film including a Ti film and a TiN film formed thereon.

4. The semiconductor device according to claim 1, further comprising an insulating film provided on the first barrier metal film, wherein the opening extends through the insulating film.

5. The semiconductor device according to claim 4, wherein the insulating film is an SiN film.

6. The semiconductor device according to claim 4, wherein the insulating film is an $SiO_2$ film.

* * * * *